United States Patent [19]

Donnell et al.

[11] 4,109,212

[45] Aug. 22, 1978

[54] COMPLEMENTARY DISTORTION CIRCUIT

[75] Inventors: John Robinson Donnell, Exeter, N.H.; George Ludwig Heiter, Andover; Hotze Miedema, Boxford, both of Mass.

[73] Assignee: Bell Telephone Laboratories, Incorporated, Murray Hill, N.J.

[21] Appl. No.: 736,995

[22] Filed: Oct. 29, 1976

[51] Int. Cl.$^2$ ............................................. H03B 1/04
[52] U.S. Cl. ................................. 328/163; 307/237; 307/320; 333/14; 333/31 R
[58] Field of Search .................... 333/10, 14; 330/149; 328/162, 163, 165; 325/476; 307/320, 237

[56] References Cited

U.S. PATENT DOCUMENTS

| | | | |
|---|---|---|---|
| 3,202,928 | 4/1965 | Prior | 330/149 X |
| 3,267,392 | 8/1966 | Hudspeth | 307/237 X |
| 3,292,093 | 12/1966 | Clarke et al. | 307/237 X |
| 3,297,882 | 1/1967 | Broadhead, Jr. | 307/237 |
| 3,371,284 | 2/1968 | Engelbrecht | 333/10 X |
| 3,383,618 | 5/1968 | Engelbrecht | 330/149 |
| 3,675,138 | 7/1972 | Standing | 328/163 |
| 3,728,648 | 4/1973 | Lerner | 333/10 X |
| 3,825,843 | 7/1974 | Felsberg et al. | 328/163 |
| 3,943,467 | 3/1976 | Yamada et al. | 307/237 X |
| 3,963,990 | 6/1976 | DiFonzo | 333/10 X |
| 3,967,220 | 6/1976 | Tagashira et al. | 333/10 X |

OTHER PUBLICATIONS

Bremenson et al., *Linearizing System for Travelling-Wave Tubes*, Revue Technique Thomson CSF, vol. 6, No. 2, 6/74, pp. 529-548.

*Primary Examiner*—Paul L. Gensler
*Attorney, Agent, or Firm*—Bryan W. Sheffield; Sylvan Sherman

[57] ABSTRACT

A complementary distortion circuit for reducing the level of IM products in the output of a TWT amplifier. One embodiment of the invention includes a 3 db, 90° coupler to divide the input signal into two components of equal amplitude but differing phase with an IM generator positioned in the path of each component. The IM generator may comprise non-linear phase modulators or non-linear amplitude modulators. The two components are then re-combined in a second, 3 db, 90° coupler. The non-linear phase-modulators may comprise varactors and the non-linear amplitude modulators may comprise varistors. The unit is intended to operate in the microwave region.

10 Claims, 6 Drawing Figures

COMPLEMENTARY DISTORTION CIRCUIT

BACKGROUND OF THE INVENTION (a) Field of the Invention

Broadly speaking, this invention relates to signal transmission systems. More particularly, in a preferred embodiment, this invention relates to signal transmission systems in which the distortion produced by nonlinearities in the operation of an active device is substantially eliminated through the introduction of a compensating, distortion-cancelling signal.

(b) Discussion of the Prior Art

Pre-distortion and post-distortion techniques for cancelling the distortion introduced by the non-linear transfer characteristics of active devices, such as amplifiers, are well known. In a typical prior art arrangement, for example, as discussed in U.S. Pat. No. 3,383,618 which issued on May 14, 1968 to R. S. Engelbrecht, a non-linear device in a compensation circuit is driven by a portion of the output signal of an amplifier. The non-linear device generates a composite signal containing a host of distortion components covering a range of multiple orders of distortion. All of these distortion components pass through two controllers, one for phase and the other for amplitude, before they are coupled with the output signal of the amplifier to provide a reduction in overall signal distortion through complementary cancellation. In the above and other similar arrangements, it is necessary to adjust the phase and amplitude of all of the distortion components as a single composite signal to eliminate the third-order distortion and thereby obtain an overall reduction in signal distortion.

Whenever the signal bandwidth is small compared to the center frequency, the even orders of non-linear distortion fall outside the signal band and only certain odd orders of distortion fall inside the signal band. Of these odd orders of distortion the third order is likely to be the largest and most troublesome. The higher orders of distortion, that is orders greater than the third, which are present in the output of an uncompensated bandpass amplifier, are usually small. The higher, odd-order distortion components present in the output of the non-linear device which is used to compensate the amplifier have a different phase and amplitude than the corresponding higher orders of distortion in the output of the amplifier. These differences are due to unavoidable minute deviations between the characteristics of the compensating non-linear device and the amplifier. Therefore, when these two outputs are combined, the third-order distortion may be reduced, but the higher orders of distortion are typically magnified. This disadvantageous compromise renders many prior art distortion compensation techniques ineffective for numerous applications. Such compensation techniques are particularly inadequate for use in analogue transmission systems which employ, in tandem, numerous repeater amplifiers in the transmission path.

To overcome the above problem, the distortion compensating circuit disclosed in commonly-assigned U.S. Pat. No. 3,825,843, which issued on July 23, 1974 to R. I. Felsberg and H. Miedema, was developed. In this circuit, third-order distortion in a signal path is substantially eliminated without a detrimental increase in higher orders of distortion. A portion of the signal in the signal path is extracted and applied to a squarer and a multiplier which together comprise a compensation circuit. The squarer operates on its input signal to produce a second-order output signal. In the multiplier, the second-order output signal and the other input signal thereto are multiplied together to produce a third-order output signal. The phase and amplitude of the third-order signal are adjusted to provide a compensating signal. This compensating signal is then coupled to the signal path so that the third-order distortion produced in the signal path is substantially eliminated through complementary cancellation.

Although the circuit disclosed in the above-referenced U.S. Pat. 3,825,843 was successful in eliminating third-order distortion, the interaction between this circuit and the non-linear circuit it is intended to linearize introduces higher orders of distortion not originally present in the output signal. These higher order distortion components are, however, relatively low in amplitude when the output level is well below saturation and do not pose a problem in most applications. However, the level of these higher order components increases rapidly with increasing signal levels and the trend to even higher output levels can reach the point where these higher-order distortion components may no longer safely be ignored.

Accordingly, as taught in the U.S. Pat. No. 4,016,497, if the distortion compensating circuit shown in U.S. Pat. No. 3,825,843 is modified such that it operates in a feedbackward mode rather than a feedforward mode, the third-order distortion terms are eliminated, as before, but without the generation of additional higher order distortion terms.

Unfortunately, even the improved distortion cancelling circuit disclosed in the referenced co-pending application of Miedema has its drawbacks. More specifically, the circuit is relatively expensive to manufacture, due to the cost of the cuber, phase resolver, amplifier, etc., and the initial adjustment of the device is fairly complex, due to the need to adjust the delay of the separate circuit branches.

An article entitled "Réseau linéariseur pour tube á onde progressive" (Linearizing System for Travelling-Wave Tubes) by C. Bremenson and P. Jaubert, Revue Technique Thomson CSF, Vol. 6, No. 2, June 1974, pp. 529-548, discloses a complementary distortion circuit which employs a varistor arrangement as the non-linear element in a bridge circuit. As shown in FIG. 9 of the Bremenson and Jaubert article, the complementary distortion circuit, designed to operate at 6 GHz, includes a 3 db — 90° hybrid coupler, a 3 db — 180° hybrid coupler and a non-linear varistor circuit in the lower branch. This arrangement is intended to maximize the output power of a travelling wave tube, given that the level of intermodulation products should be at least 25 db below the level of the fundamental signals of the TWT output.

Unfortunately, this arrangement does not solve the problem with which applicants were faced — namely to reduce the level of IM products at a TWT output by 25 db, a far more difficult requirement and one which cannot be solved unless the effects of gain compression/expansion and capacitive/inductive AM/PM conversion are simultaneously accounted for.

SUMMARY OF THE INVENTION

Fortunately, the complementary distortion circuit disclosed and claimed herein solves the above problems, and more. More particularly, in a preferred embodiment, the invention comprises a distortion compensating circuit for a signal path subject to distortion. This circuit is characterized by means for dividing the signal path into two components of equal amplitude but differing phase and a first, non-linear phase modulator for introducing a phase-shift into one of the components, the phase shift being proportional to the instantaneous signal power in the component. The circuit further includes a second, non-linear phase modulator for introducing a phase shift into the other one of the components, the phase shift being proportional to the instantaneous signal power in the component and means, connected to the output of the first and second phase modulator, for recombining the phase-shifted components.

The invention and its mode of operation will be more fully understood from the following detailed description, when taken with the appended drawing in which:

DETAILED DESCRIPTION OF THE INVENTION

Figure 1:
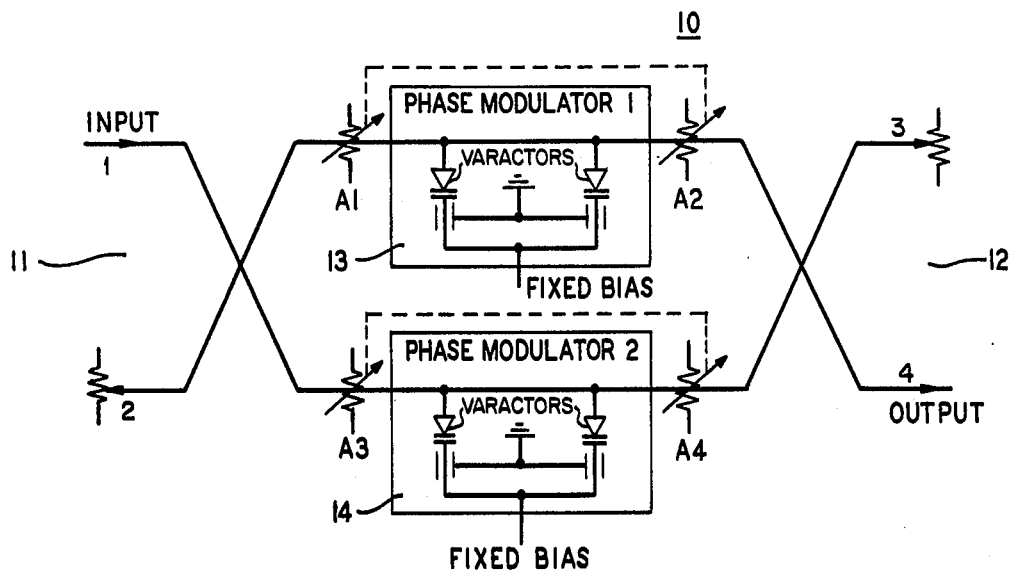
FIG. 1 is a schematic diagram of a first embodiment of the invention which employs varactor phase modulators.
Figure 2:
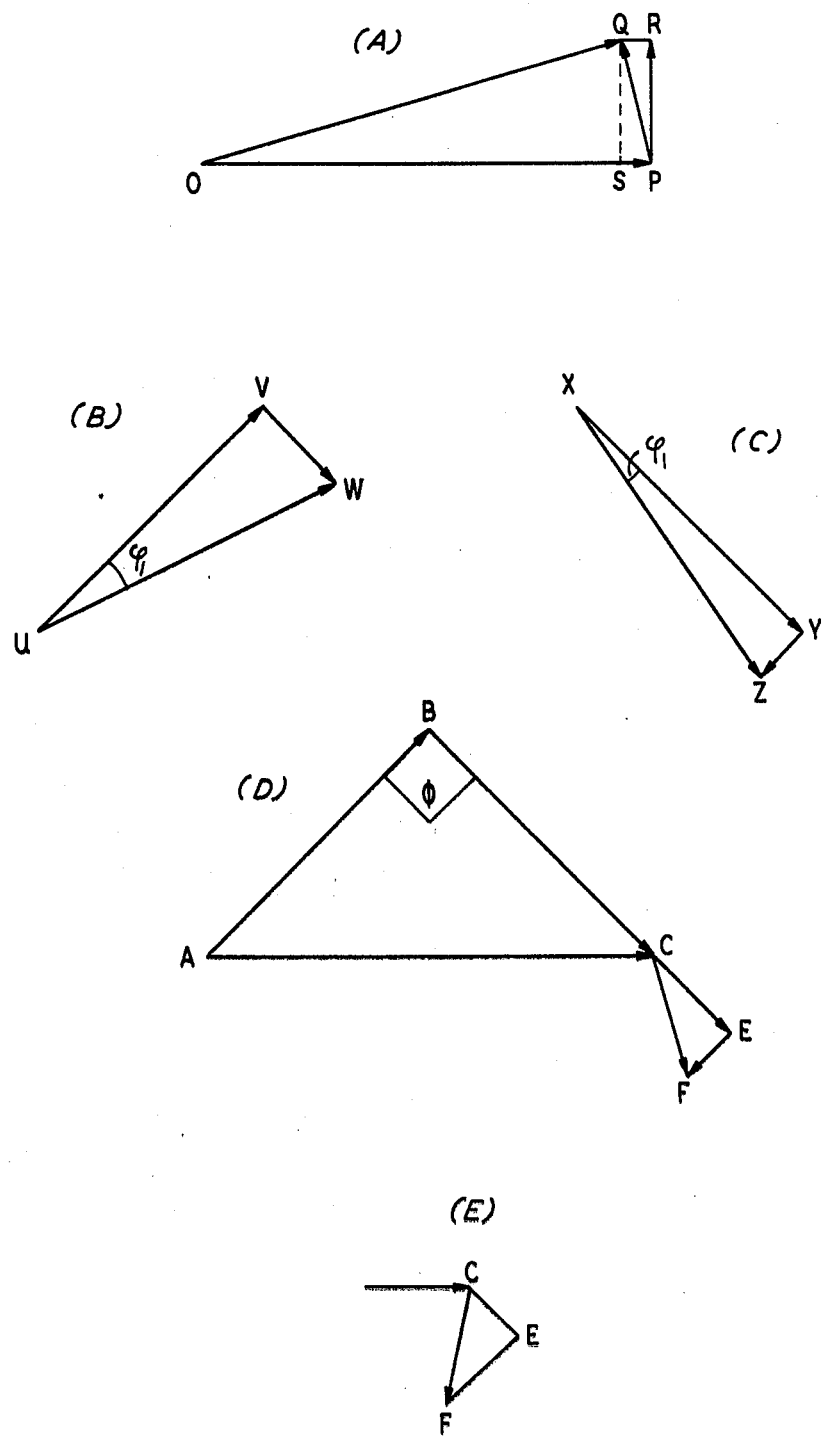
FIG. 2 is a series of vector diagrams useful in explaining the operation of the circuit shown in FIG. 1.

FIG. 1 depicts an illustrative complementary distortion circuit according to the invention. This embodiment employs varactors as the non-linear elements but, as will be discussed, other non-linear elements may also be employed. The associated vector diagrams for this circuit, are shown in FIG. 2. These diagrams assume the use of a single frequency signal. It will further be assumed that the only distortion of interest is the third-order, in-band distortion.

As shown in FIG. 1, complementary distortion circuit 10 comprises a 3 db, 90° coupler 11 and a 3db, 180 coupler 12 associated with the input and output of distortion circuit 10. A pair of phase modulators 13 and 14 are respectively connected between the ports of couplers 11 and 12. Mechanically-coupled, adjustable attenuators A1, A2 and A3, A4 are respectively connected in the input and output circuits of phase modulators 13 and 14.

Turning now to the vector diagram of FIG. 2, FIG. 2A represents the output of a typical amplifier which is driven by a single frequency input signal. In the absence of distortion, the output of this amplifier would have been represented by the vector $\overline{OP}$. The effects of an unwanted AM/PM conversion within the amplifier are represented by the vector $\overline{PR}$ and the effects of an unwanted gain compression are represented by the vector $\overline{PS}$. Together, vectors $\overline{PR}$ and $\overline{PS}$ combine to produce a distortion vector $\overline{PQ}$ and the resultant distorted amplifier output is represented by the vector $\overline{OQ}$. Obviously, the function of the complementary distortion circuit disclosed herein is to generate a distortion product which will exactly cancel vector $\overline{PQ}$. This situation is shown, for example, in FIG. 2D where the vector $\overline{CF}$ is exactly equal and opposite to vector $\overline{PQ}$ in FIG. 2A.

The desired cancelling distortion vector $\overline{CF}$ is generated in the complementary distortion circuit of FIG. 1 in the following manner. The input signal is divided into two, equal but orthogonal components by the 3 db coupler 11. Each of these components passes through a non-linear phase modulator which induces a phase-shift which is proportional to the instantaneous signal power. The non-linear phase modulation results from the fact that the reactance of the varactors employed in the modulators depends upon the signal level applied thereto. In the circuit shown in FIG. 1, reflections are minimized by using the varactors in pairs spaced apart by one-quarter wavelength. In addition, it may be advantageous to tune-out the average capacity of each varactor, by using a suitable inductive arrangement.

FIG. 2B represents the signal which passes through the upper branch of FIG. 1, that is to say the signal which passes through phase modulator 13, as it would appear at output port 4. The angle $\phi_1$ in FIG. 2B is proportional to the instantaneous signal power, i.e., to the square of the applied signal amplitude. Thus, the distortion vector $\overline{VW}$ which is produced in phase modulator 13 will be proportional to the cube of the signal amplitude. Similarly, as shown in FIG. 2C, the signal passing through the lower branch of the complementary distortion circuit, that is to say, the signal passing through phase modulator 14, is shifted in phase by an angle $\phi_2$ which is also proportional to the instantaneous signal power, which results in a distortion vector $\overline{YZ}$. The output coupler 12 combines the signals shown in FIGS. 2B and 2C into the signal shown by FIG. 2D. In FIG. 2D, vector $\overline{AB}$ represents the input to phase modulator 13 and corresponds to the vector $\overline{UV}$ in FIG. 2B. Similarly, vector $\overline{BC}$ represents the input to phase modulator 14 and corresponds to vector $\overline{XY}$ in FIG. 2C. Vector $\overline{CE}$ is the distortion generated in phase modulator 13 and corresponds to vector $\overline{VW}$ in FIG. 2B, and vector $\overline{EF}$ represents the distortion generated in phase modulator 14 and corresponds to vector $\overline{YZ}$ in FIG. 2C. It will be seen that by the appropriate adjustment of the circuit parameters the total distortion vector $\overline{CF}$ can be made equal and opposite to the distortion vector PQ which is produced within the amplifier to be equalized. Thus, the distortion vector $\overline{PQ}$ will be cancelled by vector $\overline{CF}$.

Note that although both non-linear phase modulators receive equal input signals they do not generate the same level of distortion, that is to say, $\overline{EF} \neq \overline{CE}$. While both $\overline{EF}$ and $\overline{CE}$ are proportional to the cube of the signal amplitude, the respective proportionality constants are different. If the phase modulators were to generate the same level of distortion, the combined distortion vector would represent only phase modulation and the complementary distortion circuit would not have the capacity to cancel the effects of gain compression or expansion.

It is not essential to have precisely a 90 degree phase shift between the inputs to the phase modulators. Other phase differences may be employed so long as the inputs to both phase modulators have orthogonal components. However, as discussed above, a different degree of phase modulation in the two branches of the circuit is essential if the effects of gain compression or expansion are to be cancelled.

Various techniques can be employed to adjust the amplitude and phase of the distortion generated within each complementary distortion circuit. In FIG. 1, two sets of coupled, adjustable attenuators, A1, A2 and A3, A4, are employed to adjust the distortion level. Attenuators A1 and A2, as well as attenuators A3 and A4, are coupled in such a way that the sum of their attenuation is constant. In this embodiment, then, the linear outputs of the phase modulators are independent of the attenuation setting but the third order components generated in the phase modulators change by 2 db for every 1 db change in A1 or A3.

The level of distortion generated in the phase modulators may also be controlled by varying the varactor bias. This is illustrated in the alternate embodiment shown in FIG. 3, which is essentially identical to the arrangement shown in FIG. 1 except that the attenuators A1, A2 and A3, A4 are omitted and adjustable biasing means 16 and 17 substituted therefor. In this embodiment of the invention, care must be taken to ensure that the phase shift introduced by the complementary distortion circuit does not depend on the varactor bias since this would make the linear output also dependent on that bias. This limitation mandates that the reactance of the varactor diodes be high compared to the line impedance, which is not difficult to achieve in practice.

Figure 3:
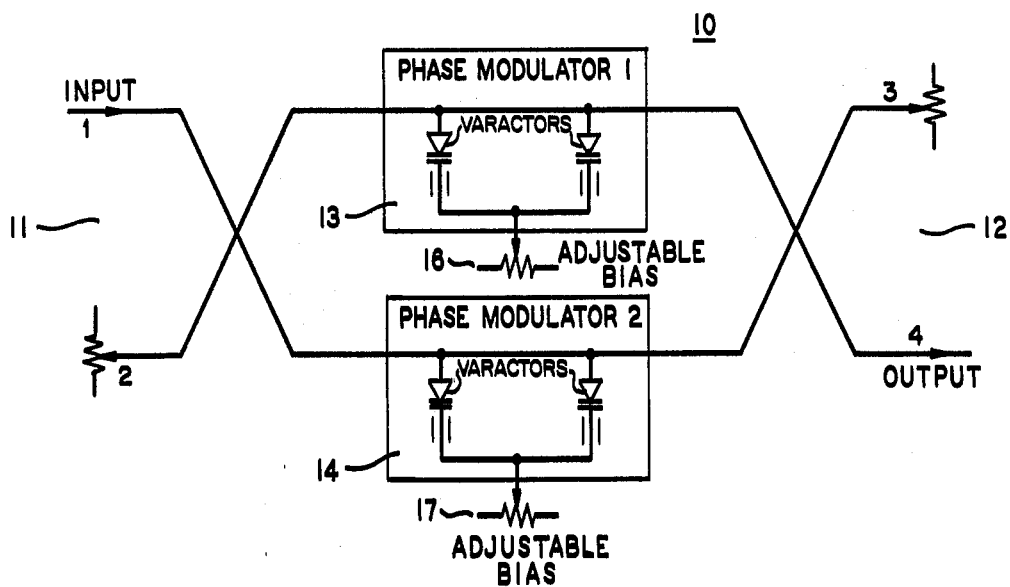
FIG. 3 is a schematic drawing of a second embodiment of the invention which employs variable biasing on the varactor phase modulators.
Figure 4:
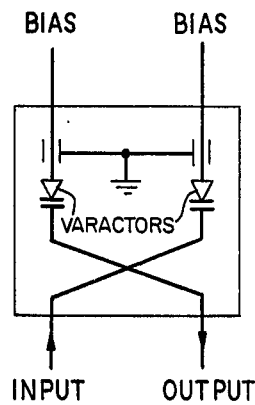
FIG. 4 is a schematic diagram of an alternative form of varactor phase modulator for use in the circuit shown in FIGS. 1 and 3.

Instead of the varactor-loaded transmission line type of phase modulator shown in FIGS. 1 and 3, a reflective type of phase modulator may also be employed. Use of this type of phase modulator, as shown in FIG. 4, would not change the biasing and control arrangements of the circuits previously discussed.

As previously mentioned, the degree of phasemodulation generated in both branches of the complementary distortion circuits shown in FIGS. 1 and 3 should not be equal, nor should the signals in both branches be in-phase or in anti-phase.

This becomes evident if we analyze the basic complementary distortion circuit shown in FIG. 3. If the phase shifts introduced in the two branches of the circuit are $\phi_1$ and $\phi_2$, then we find the following values for the S parameters of the Laplace transform:

$$S_{13} = -\frac{1}{2}(e^{j\phi_1} - je^{j\phi_2})$$

$$S_{14} = +\frac{1}{2}(e^{j\phi_1} + je^{j\phi_2})$$

$$S_{12} = 0$$

This leads to the following formulas for magnitude and phase:

$$|S_{13}| = \cos\left(\frac{\pi}{4} + \frac{\phi_1 - \phi_2}{2}\right)$$

$$\angle(S_{13}) = -\frac{\pi}{4} + \frac{1}{2}(\phi_1 + \phi_2)$$

$$|S_{14}| = \sin\left(\frac{\pi}{4} + \frac{\phi_1 - \phi_2}{2}\right)$$

$$\angle(S_{14}) = \frac{\pi}{4} + \frac{1}{2}(\phi_1 + \phi_2).$$

In the varactor arrangement discussed above, $\phi_1$ and $\phi_2$ are introduced by non-linear phase-shifters which generate a phase-shift which is proportional to the square of the signal amplitude. Thus, if a single frequency signal with amplitude $v$ is applied to port 1, the phase shifts $\phi_1$ and $\phi_2$ may be given by:

$$\phi_1 = \alpha + r_1 v^2$$

$$\phi_2 = \beta + r_2 v^2$$

where $$r_1 v^2 << \pi/2$$

$$r_2 v^2 << \pi/2$$

and where $\alpha$ and $\beta$ represent fixed phase shifts. With these non-linear phase shifts, the S parameters become $$|S_{13}| = \cos\left[\frac{1}{2}(\alpha - \beta) + \frac{\pi}{4}\right] +$$
$$\frac{1}{2}(r_2 - r_1)v^2 \sin\left[\frac{1}{2}(\alpha - \beta) + \frac{\pi}{4}\right]$$

$$\angle(S_{13}) = -\frac{\pi}{4} + \frac{1}{2}(\alpha + \beta) + \frac{1}{2}(r_1 + r_2)v^2$$

$$|S_{14}| = \sin\left[\frac{1}{2}(\alpha - \beta) + \frac{\pi}{4}\right] +$$
$$\frac{1}{2}(r_1 - r_2)v^2 \cos\left[\frac{1}{2}(\alpha - \beta) + \frac{\pi}{4}\right]$$

$$\angle(S_{14}) = \frac{\pi}{4} + \frac{1}{2}(\alpha + \beta) + \frac{1}{2}(r_1 + r_2)v^2;$$

The magnitude of S is a measure for the insertion loss between the terminals of the phase modulators and the argument of S is a measure for the phase shift. When the input is at port 1, we find for the output - at port 3:
  Out/input voltage ratio: $\cos[\frac{1}{2}(\alpha-\beta) + \pi/4]$
  In-phase distortion: $\frac{1}{2}(r_2-r_1)v^3 \sin[\frac{1}{2}(\alpha-\beta) + \pi/4]$
  Quadrature phase distortion: $\frac{1}{2}(r_1+r_2) v^3$ at port 4:
  Output/input voltage ratio: $\sin[\frac{1}{2}(\alpha-\beta) + \pi/4]$
  In-phase distortion: $\frac{1}{2}(r_1-r_2)v^3 \cos[\frac{1}{2}(\alpha-\beta) + \pi/4]$
  Quadrature phase distortion: $+\frac{1}{2}(r_1+r_2) v^3$ Depending upon the type of distortion to be cancelled, it appears that it may be necessary to use either output port 4 or output port 3. Considering that the output voltage cannot be zero, we find that in-phase distortion can only be cancelled if $(\alpha-\beta)$ is neither 90° or 270° ($\pm$n 360°).

Either output port can be used to correct for gain compression or expansion as long as the phase modulation constants $r_1$ and $r_2$ have a difference $(r_1-r_2)$ of the appropriate sign.

The use of non-linear reactances with coefficients $r_1$ and $r_2$ of opposite sign will change the sign of the quadrature phase distortion and make it possible to cancel either capacitive or inductive quadrature distortion.

The output/input voltage ratio for both output ports depends on the phase difference $(\alpha-\beta)$. At port 3, this ratio approaches unity if $(\alpha-\beta) \rightarrow 90°$; at port 4 it approaches unity $(\alpha-\beta) \rightarrow +90°$. At neither output port can we obtain this maximum, since that would eliminate the in-phase distortion produced in the complementary distortion circuit. The actual value of $(\alpha-\beta)$ should be a compromise between the insertion loss of the distortion circuit and its ability to generate in-phase distortion.

By changing the ratio of the phase modulation introduced by the phase modulators, it is possible to adjust the phase angle of the distortion product. This makes it possible to precisely match the complementary distortion generated in the circuit to be equalized. FIGS. 2D and 2E show the various possibilities under these circumstances and cover the situation where the amplifier introduces gain compression or gain expansion. As discussed above, the sign of the phase modulation depends upon the type of non-linear reactance used.

Figure 5:
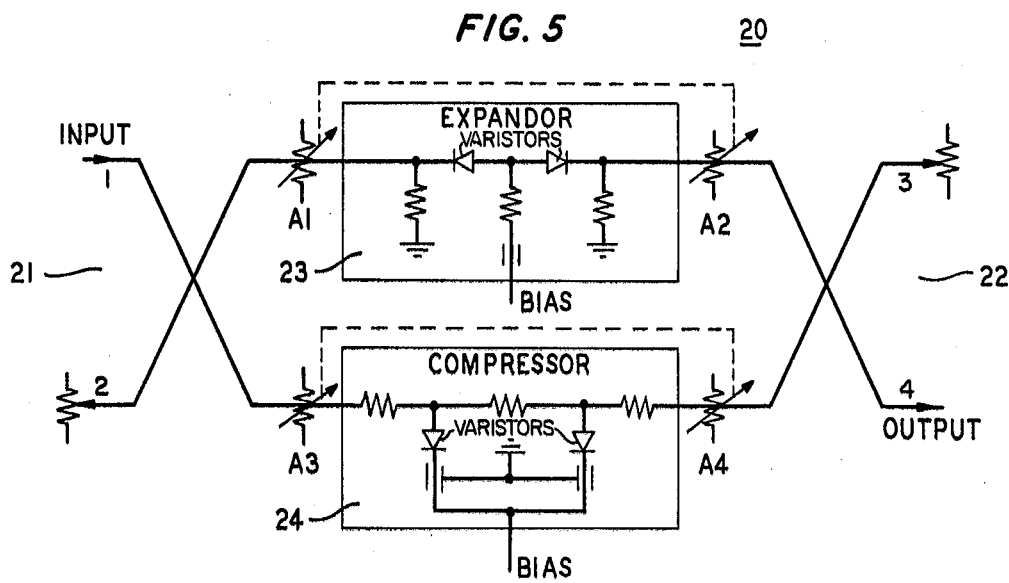
FIG. 5 is a schematic diagram of a third embodiment of the invention which employs a varistor expandor and a varistor compressor in the upper and lower circuit branches respectively.

Referring to FIG. 2D, it will be noticed that the distortion generated in the complementary distortion circuit could also have been produced if non-linear attenuators were employed instead of non-linear phase modulators. The reason for this is that vector $\overline{CE}$ is in phase with vector $\overline{BC}$ and vector $\overline{EF}$ is 180 degrees out-of-phase with vector $\overline{AB}$. A complementary distortion circuit based on this mode of operation is shown in FIG. 5. As shown, complementary distortion circuit 20 comprises a pair of 3 db, 90° couplers 21 and 22 with an expandor circuit 23 and a compressor circuit 24 respectively connected between the ports of the couplers 21 and 22. Coupled attenuators A1, A2 and A3, A4 are respectively associated with the inputs and outputs of the expandor and compressor, in a manner which is analogous to that discussed above with reference to FIGS. 1 and 3.

In operation, the input signal is separated into two, equal, orthogonal components. One of these components is passed through a non-linear attenuator used as expandor 23. The other signal component passed through a second, non-linear attenuator which comprises compressor 24. Both expandor 23 and compressor 24 operate instantaneously and include non-linear resistors, or varistors, which have an incremental conductance di/dv which is dependent upon the square of the signal amplitude. When used in the attenuator arrangement shown, the varistors cause a third order, non-linear component to be generated which yields either an expansion or compression effect.

Appropriate adjustments to both the expandor and the compressor causes the distortion produced by the complementary distortion circuit to cancel the unwanted distortion. Note, again, that vectors $\overline{CE}$ and $\overline{EF}$ in FIG. 2D cannot be equal if the gain compression or expansion effects within the amplifier are to be corrected.

As was the case in the varactor type distortion circuits shown in FIGS. 1 and 3, the input signal does not necessarily have to be split into orthogonal components so long as the signal components produced at output port 4 are not in phase or 180° out-of-phase. The technique employed to adjust the distortion generator shown in FIG. 5 is similar to that used in FIG. 1. More specifically, the adjustment is made by changing the two sets of coupled attenuators A1, A2 and A3, A4. Again, the sum of the attenuation of attenuators A1 and A2 as well as the sum of the attenuation of attenuators A3 and A4 should be kept constant to maintain a constant signal level. The expandor and compressor shown in FIG. 5 are typically employed at IF frequencies. A somewhat different arrangement, for example 3 db couplers employing varistor diodes as reflection or transmission elements, may be more advantageous for use at microwave frequencies.

Figure 6:
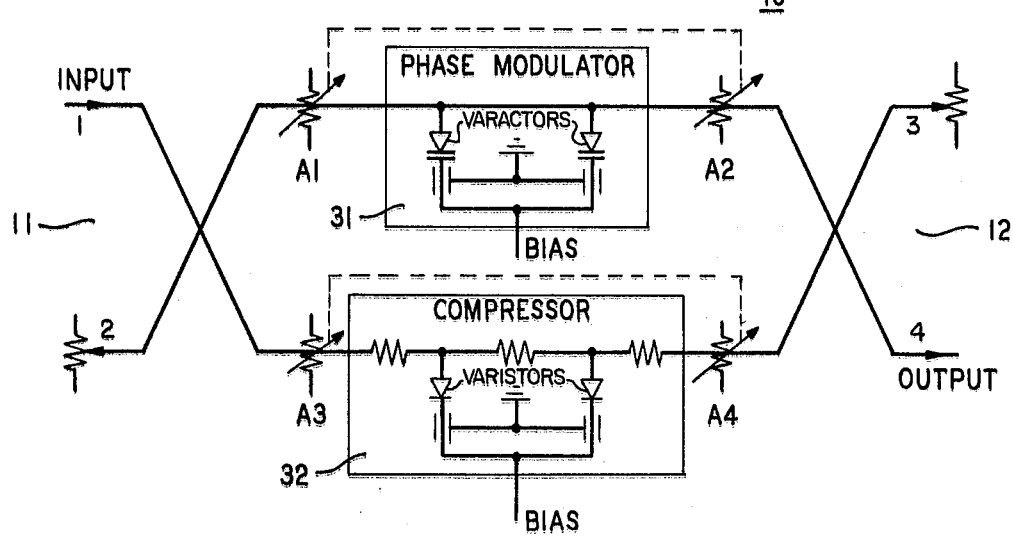
FIG. 6 is a schematic diagram of a fourth embodiment of the invention which comprises a hybrid arrangement of the embodiment shown in FIGS. 1 and 5.

One skilled in the art will appreciate that a hybrid version of the above described complementary distortion circuit may also be constructed. As shown in FIG. 6, this hybrid employs a non-linear phase shifter 31 in one branch and a non-linear attenuator 32 in the other branch. This arrangement requires that the signals in both branches be in-phase. The output coupler then combines the modulated, in-phase components into a signal having the desired amplitude and phase modulation to correct the distortion. In light of the description above of both the varactor and varistor complementary distortion circuits, the hybrid version shown in FIG. 6 is self-explanatory and need not be further described.

Varistors which are used as non-linear attenuators inevitably induce signal losses which must be compensated for by increased gain in the signal path. This drawback does not occur when the distortion is generated by means of non-linear phase shifters and for that reason the circuit shown in FIG. 1 is the preferred embodiment. In addition, it can be shown that a varactor may be driven to higher signal levels than an exponential varistor diode before unwanted higher order non-linear terms become noticeable.

One skilled in the art may make various changes and substitutions to the layout of parts shown without departing from the spirit and scope of the invention.

What is claimed is:

1. A distortion compensating circuit for a signal path subject to distortion characterized by:
   means for dividing the signal in said signal path into two components of equal amplitude but differing phase;
   a first, non-linear phase modulator for introducing a phase-shift into one of said components, said phase-shift being proportional to the instantaneous signal power in said component;
   a second, non-linear phase modulator for introducing a phase-shift into the other one of said components, said phase-shift being proportional to the instantaneous signal power in said component; and
   means, connected to the output of said first and second phase modulators, for re-combining said phase-shifted components.

2. The apparatus according to claim 1 wherein said two signal components are orthogonal.

3. The apparatus according to claim 1 wherein said two signal components are non-orthogonal but include orthogonal components.

4. The apparatus according to claim 1 wherein said first and second phase-modulators each comprises:
   first and second commonly poled varactors spaced apart by approximately one quarter wavelength at the frequency of interest;
   means for applying a fixed bias to said varactors; and
   first and second coupled signal attenuators respectively associated with the input and output of the phase-modulator.

5. The apparatus according to claim 1 wherein said first and second phase-modulators each comprise:
   first and second commonly poled varactors spaced apart by approximately one quarter wavelength at the frequency of interest; and
   means for applying a variable bias to said varactors to vary the level of distortion generated therein, the reactance of said varactors being high relative to the line impedance.

6. The apparatus according to claim 1 wherein said first and second phase-modulators each comprises:
   a reflective phase-modulator comprising a pair of non-linear reactive devices connected to the ports of a coupling network.

7. A distortion compensating circuit for a signal path subject to distortion characterized by:

means for dividing the signal in said signal path into two components of equal amplitude but differing phase;

a first, non-linear attenuator for expanding the amplitude of one of said components, the degree of expansion being proportional to the instantaneous signal power in said component;

a second, non-linear attenuator for compressing the amplitude of the other one of said components, the degree of compression being proportional to the instantaneous signal power in said component; and means connected to the output of said first and second non-linear attenuators, for re-combining said expanded and compressed signal components.

8. The apparatus according to claim 7 wherein said first attenuator includes:

a pair of serially connected, oppositely-poled varistors;

means for supplying a fixed bias to the juncture of said varistors; and first and second coupled signal attenuators respectively associated with the input and output of said first attenuator.

9. The apparatus according to claim 7 wherein said second attenuator includes;

a pair of parallel connected, similarly poled varistors;

means for applying a fixed bias to the juncture of said varistors; and first and second coupled signal attenuators respectively associated with the input and output of said second attenuator.

10. A distortion compensation circuit for a signal path subject to distortion characterized by:

means for dividing the signal in said signal path into two components of equal amplitude but differing phase;

a non-linear phase modulator for introducing a phase-shift into one of said components, said phase-shift being proportional to the instantaneous signal power in said component;

a non-linear attenuator for modulating the amplitude of the other one of said components, the degree of modulation being proportional to the instantaneous signal power in said component; and means, connected to the output of the non-linear phase modulator and attenuator, for recombining the phase modulated and amplitude modulated signal components.

* * * * *